(12) United States Patent
Kuo et al.

(10) Patent No.: US 10,163,842 B2
(45) Date of Patent: Dec. 25, 2018

(54) SEMICONDUCTOR STRUCTURE AND MANUFACTURING METHOD THEREOF

(71) Applicant: TAIWAN SEMICONDUCTOR MANUFACTURING CO., LTD., Hsinchu (TW)

(72) Inventors: Chien-Hung Kuo, Tainan (TW); Chin-Yu Ku, Hsinchu (TW); Yuh-Sen Chang, Hsinchu County (TW); Hon-Lin Huang, Hsinchu (TW); Sheng-Yu Wu, Hsinchu (TW); Ching-Hui Chen, Hsinchu (TW); Mirng-Ji Lii, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/489,954

(22) Filed: Apr. 18, 2017

(65) Prior Publication Data

US 2018/0301430 A1   Oct. 18, 2018

(51) Int. Cl.
*H01L 33/50* (2010.01)
*H01L 23/00* (2006.01)

(52) U.S. Cl.
CPC ............. *H01L 24/14* (2013.01); *H01L 24/03* (2013.01); *H01L 24/06* (2013.01); *H01L 24/11* (2013.01); *H01L 24/13* (2013.01); *H01L 2224/0401* (2013.01); *H01L 2224/0603* (2013.01); *H01L 2224/13082* (2013.01); *H01L 2224/1403* (2013.01)

(58) Field of Classification Search
CPC ......... H01L 24/03; H01L 24/06; H01L 24/11; H01L 24/13; H01L 24/14
See application file for complete search history.

(56) References Cited

U.S. PATENT DOCUMENTS

2011/0297986 A1* 12/2011 Nishiuchi .............. H01L 24/06
257/98
2015/0181703 A1* 6/2015 Tanaka .................. H01L 23/145
361/748

\* cited by examiner

*Primary Examiner* — Cuong Q Nguyen
(74) *Attorney, Agent, or Firm* — McClure, Qualey & Rodack, LLP

(57) ABSTRACT

A semiconductor structure includes an interconnect structure, at least one first metal pad, at least one second metal pad, at least one first bump, at least one second bump, at least one photosensitive material, and a bonding layer. The first metal pad and the second metal pad are disposed on and electrically connected to the interconnect structure. The first bump is disposed on the first metal pad. The second bump is disposed on the second metal pad. The photosensitive material is disposed on the first bump. The bonding layer is in contact with the photosensitive material and the second bump. The photosensitive material is disposed between the first bump and the bonding layer.

20 Claims, 10 Drawing Sheets

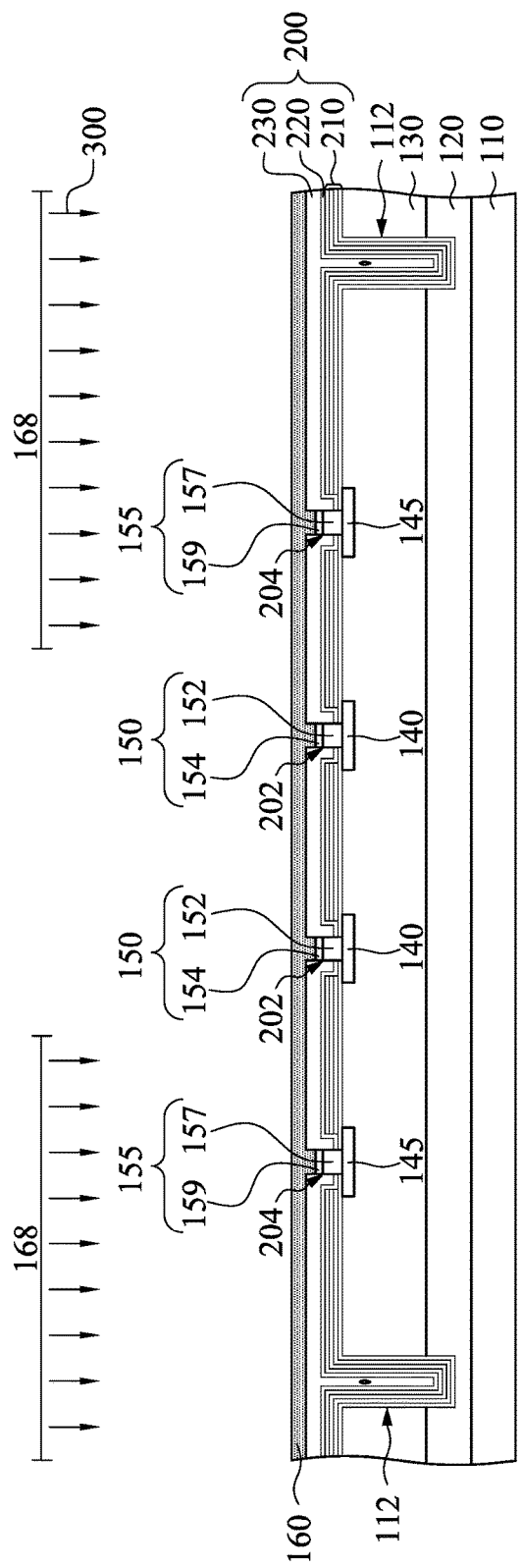
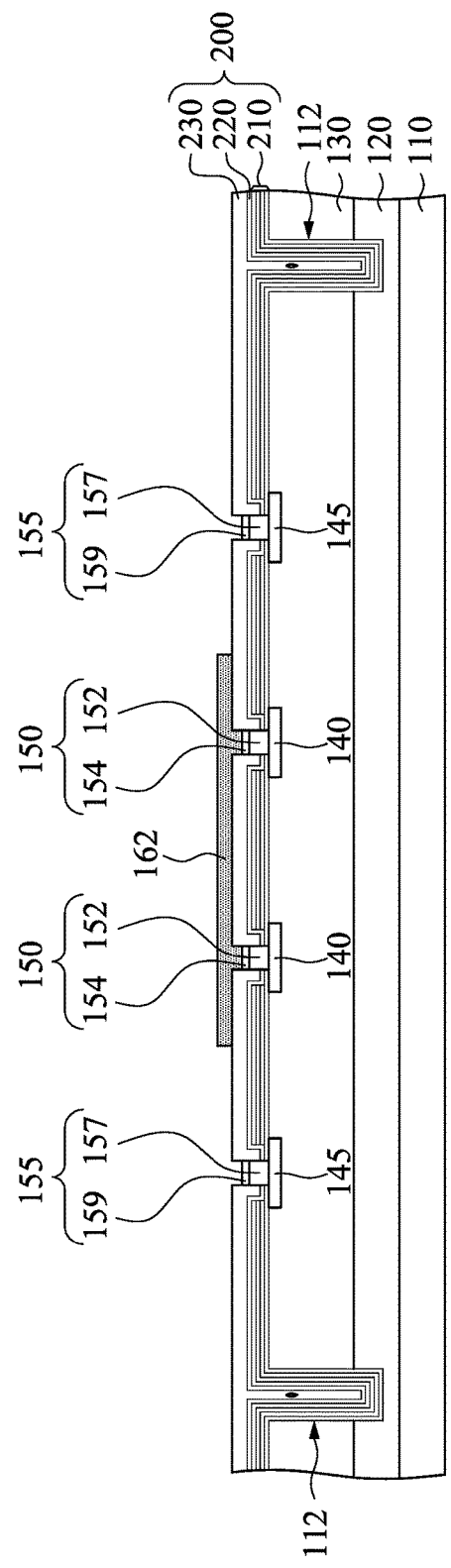
Fig. 5
Fig. 6

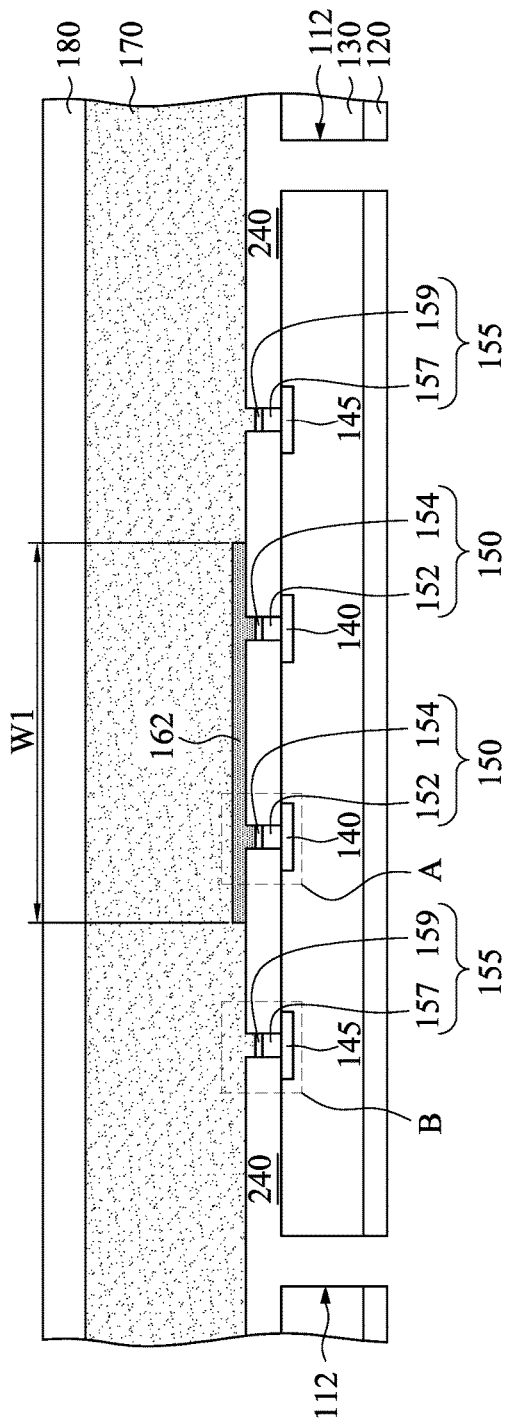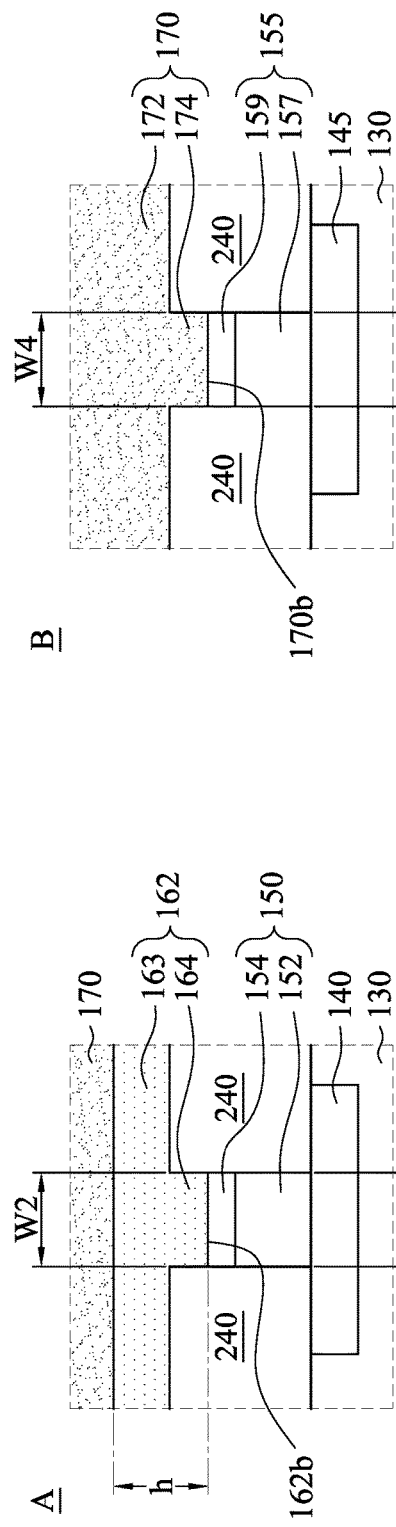
Fig. 9
Fig. 10A
Fig. 10B

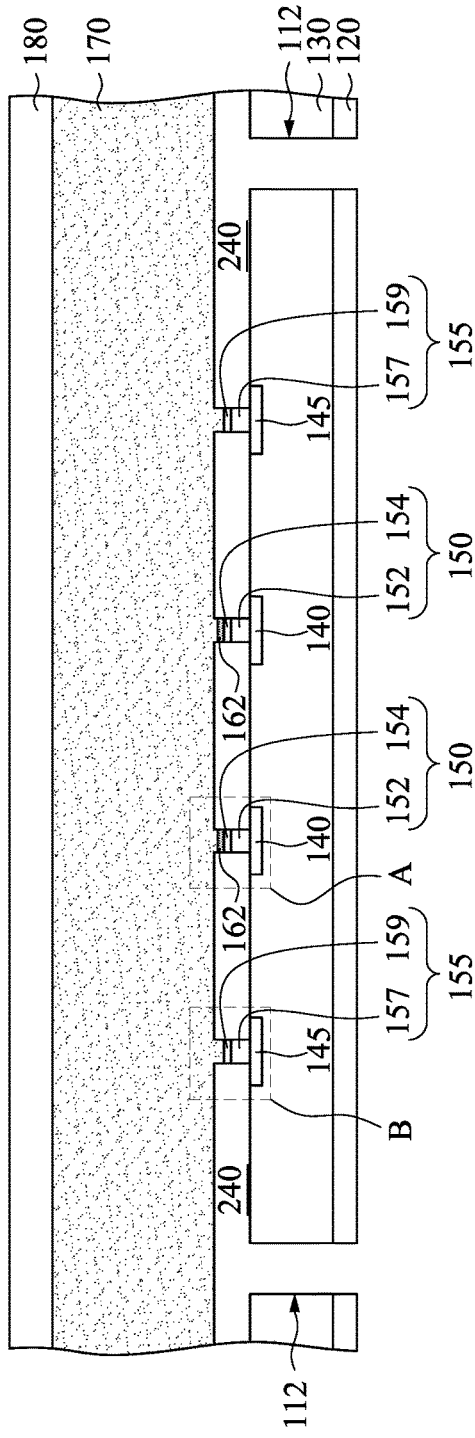
Fig. 14
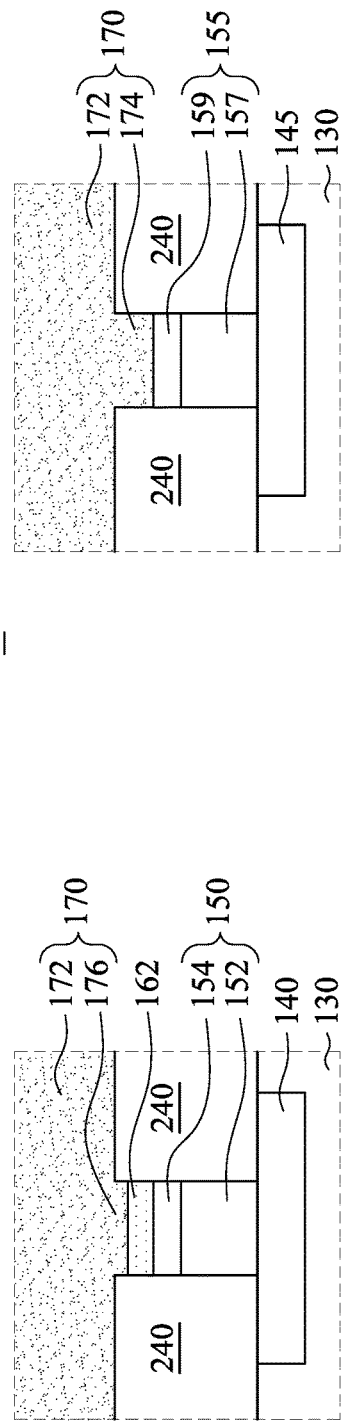
Fig. 15A
Fig. 15B

SEMICONDUCTOR STRUCTURE AND MANUFACTURING METHOD THEREOF

BACKGROUND

As development of integrated circuit (IC), the semiconductor industry has experienced continued rapid growth due to continuous improvements in the integration density of various electronic components such as transistors, diodes, resistors, capacitors, and the like. For the most part, these improvements in integration density have come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 to 9 are cross-sectional views of a method for manufacturing a semiconductor structure at various stages in accordance with some embodiments of the present disclosure.

FIG. 10A is an enlarged view of area A in FIG. 9.
FIG. 10B is an enlarged view of area B in FIG. 9.
FIG. 14 is a cross-sectional view of a semiconductor structure in accordance with some embodiments of the present disclosure.
FIG. 15A is an enlarged view of area A in FIG. 14.
FIG. 15B is an enlarged view of area B in FIG. 14.

DETAILED DESCRIPTION

Figure 1:
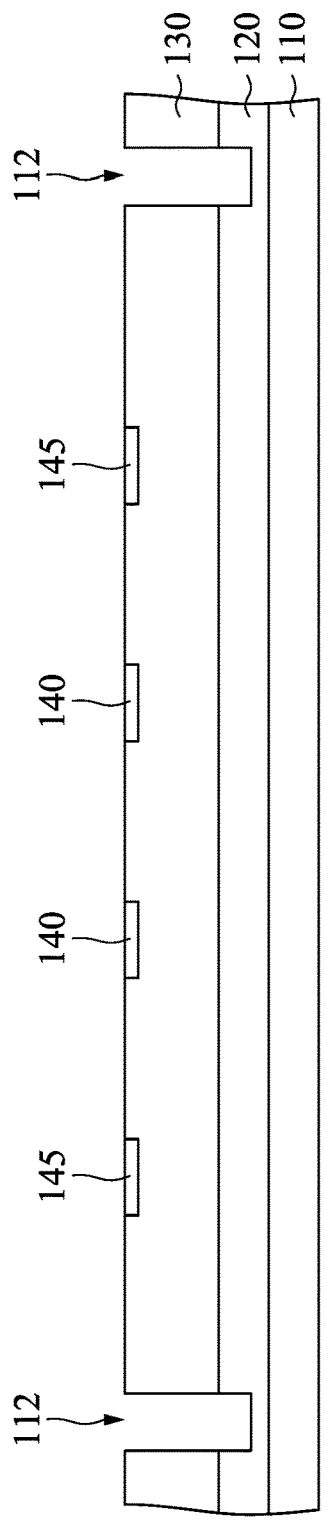

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1 to 9 are cross-sectional views of a method for manufacturing a semiconductor structure at various stages in accordance with some embodiments of the present disclosure. Reference is made to FIG. 1. A substrate 110 is provided. In some embodiments, the substrate 110 is a semiconductor substrate such as a bulk silicon substrate, a semiconductor wafer, a silicon-on-insulator (SOI) substrate, or a silicon germanium substrate, although it may include other semiconductor materials such as group III, group IV, and/or group V elements.

In some embodiments, a semiconductor layer 120 is formed on the substrate 110. In some embodiments, the semiconductor layer 120 is made of active silicon or some other suitable materials.

An interconnect structure 130 is formed on the semiconductor layer 120. The interconnect structure 130 is configured to form one or more circuits. The interconnect structure 130 includes a plurality of metallization layers including metal lines and vias (not shown) in a plurality of dielectric layers. The metal lines and vias may be formed of copper or copper alloys, and may be formed using the well-known damascene processes. The dielectric layers in the interconnect structure 130 may be made of low-k dielectric material, extreme low-k dielectric material, or silicon. The low-k dielectric material is a material with a small dielectric constant relative to silicon dioxide, whose dielectric constant is about 3.9, and the extreme low-k dielectric material has a dielectric constant lower than about 2.5. In other embodiments, the interconnect structure 130 may include commonly known inter-layer dielectric (ILDs) and inter-metal dielectrics (IMDs).

A plurality of trenches 112 are formed in the interconnect structure 130 and/or the semiconductor layer 120. In some embodiments, the trenches 112 may be formed through an etching process. The trenches 112 do not extend all the way though the substrate 110. In other words, the trenches 112 are blind holes. The number of the trenches 112 in FIG. 1 is illustrative, and should not limit the present disclosure. In some embodiments, the number of the trenches 112 can be suitably selected according to actual situations.

A plurality of first metal pads 140 and a plurality of second metal pads 145 are formed on the semiconductor structure 130. In other words, the interconnect structure 130 is formed between the substrate 110 and the first metal pads 140 and also between the substrate 110 and the second metal pads 145. In some embodiments, the first metal pads 140 and the second metal pads 145 may include copper (Cu), although it may also be made of aluminum (Al), and hence may also be referred to as an aluminum pad, silver (Ag), gold (Au), nickel (Ni), tungsten (W), alloys, or any combination thereof. In some other embodiments, the first metal pads 140 and the second metal pads 145 may be made of aluminum copper (AlCu). In some embodiments, the first metal pads 140 and the second metal pads 145 have substantially the same configuration and/or the same material. The term "substantially" as used herein may be applied to modify any quantitative representation which could permissibly vary without resulting in a change in the basic function to which it is related. The first metal pads 140 and the second metal pads 145 can be respectively and electrically connected to the interconnection structure 130. The numbers of the first metal pads 140 and second metal pads 145 in FIG. 1 are illustrative, and should not limit the present disclosure. In some embodiments, the numbers of the first metal pads 140 and second metal pads 145 can be suitably selected according to actual situations.

Figure 2:
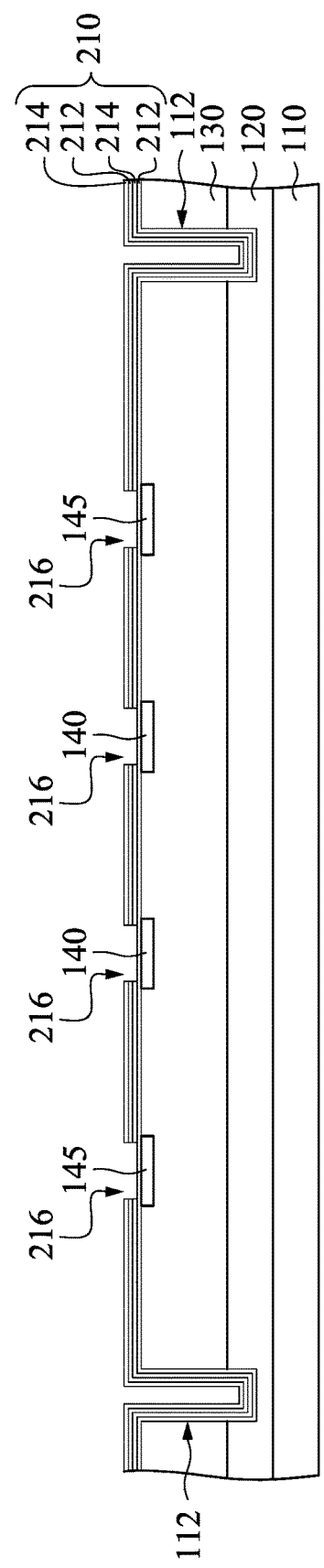

Reference is made to FIG. 2. A passivation layer 210 is formed on the structure of FIG. 1. The passivation layer 210 covers the interconnect structure 130, the first metal pads 140, and the second metal pads 145. The passivation layer 210 also conformally formed in the trenches 112. The passivation layer 210 is configured to protect the underneath structures. In some embodiments, the passivation layer 210 includes silicon oxide, silicon nitride, silicon oxynitride, or other suitable materials. In some embodiments, the passivation layer 210 includes multiple layers of alternating materials. For example, in FIG. 2, the passivation layer 210 includes a plurality of first layers 212 and a plurality of second layers 214 alternating arranged with the first layers 212. The first layers 212 can be made of silicon nitride, and the second layers 214 can be made of silicon oxide, and the present disclosure is not limited in this respect.

A plurality of recesses 216 are formed in the passivation layer 210 and respectively above the metal pads (i.e., the first metal pads 140 and the second metal pads 145). The recesses 216 may be formed through an etching process. The recesses 216 do not extend all the way though the passivation layer 210. In other words, the recesses 216 are blind holes. For example, the recesses 216 respectively expose the bottommost layer of the passivation layer 210 (i.e., one of the first layer 212), and the present disclosure is not limited in this respect.

Figure 3:
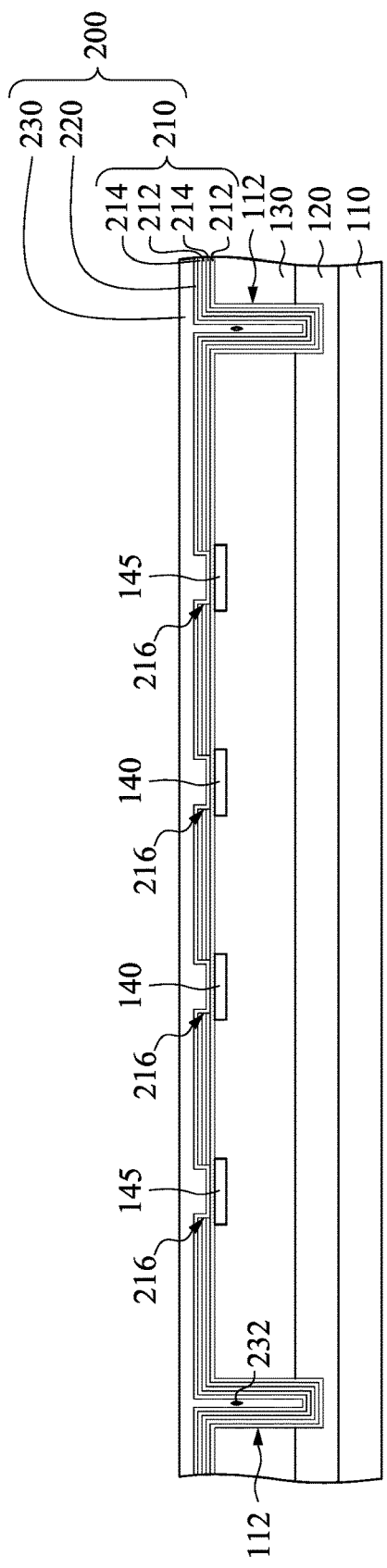

Reference is made to FIG. 3. A first dielectric layer 220 is conformally formed on the structure of FIG. 2, and a second dielectric layer 230 is formed on the first dielectric layer 220. In some embodiments, the first dielectric layer 220 is made of aluminum oxide or other suitable materials, and the second dielectric layer 230 is made of oxide, such as a high-aspect-ratio-process (HARP) formed oxide, or other suitable materials. Furthermore, the first dielectric layer 220 is conformally formed in the recesses 216 and the trenches 112, and the second dielectric layer 230 fills the remaining spaces of the recesses 216 and the trenches 112. In some embodiments, however, the second dielectric layer 230 may leave at least one void 232 in the trench 112 as shown in FIG. 3, and the present disclosure is not limited in this respect. In some embodiments, the thickness of the first dielectric layer 220 is about 10 nm, and the thickness of the second dielectric layer 230 is about 700 nm. In FIG. 3, the protection layer 210, the first dielectric layer 220, and the second dielectric layer 230 form a sacrificial layer 200.

Figure 4:
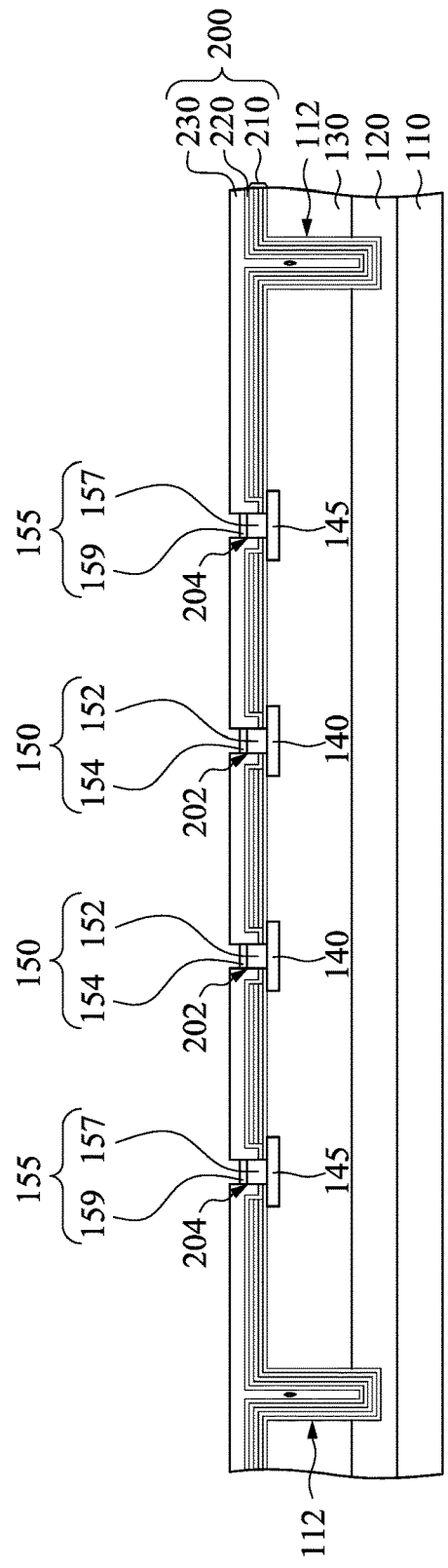

Reference is made to FIG. 4. A plurality of first openings 202 and a plurality of second openings 204 are formed in the sacrificial layer 200 and respectively within the recesses 216 (see FIG. 3). The first openings 202 respectively expose the first metal pads 140, and the second openings 204 respectively expose the second metal pads 145. In some embodiments, the first openings 202 and the second openings 204 may be formed through an etching process.

A plurality of first bumps 150 and a plurality of second bumps 155 are respectively formed in the first openings 202 and the second openings 204. The first bumps 150 are respectively formed on and in contact with the first metal pads 140, and the second bumps 155 are respectively formed on and in contact with the second metal pads 145. In some embodiments, at least one of the first bumps 150 includes a first conductive material 152 and a second conductive material 154. The first conductive material 152 is formed on the first metal pad 140, and the second conductive material 154 is formed on the first conductive material 152. In other words, the first conductive material 152 is disposed between the first metal pad 140 and the second conductively material 154. Similarly, at least one of the second bumps 155 includes a first conductive material 157 and a second conductive material 159. The first conductive material 157 is formed on the second metal pad 145, and the second conductive material 159 is formed on the first conductive material 157. In other words, the first conductive material 157 is disposed between the second metal pad 145 and the second conductively material 159. The first conductive materials 152 and 157 and the second conductive materials 154 and 159 can be made of Cu, Ni, Pt, Al, Au, combinations thereof, or other suitable materials. For example, the first conductive materials 152 and 157 can be made of Ni, and the second conductive materials 154 and 159 can be made of Au. The first conductive materials 152 and 157 and the second conductive materials 154 and 159 can be formed through one or more suitable technique(s), including electroless plating, PVD, CVD, electrochemical deposition (ECD), molecular beam epitaxy (MBE), atomic layer deposition (ALD), electroplating, and the like.

Reference is made to FIG. 5. A photosensitive layer (or a light-sensitive layer) 160 is formed on the structure of FIG. 4. For example, a spin-coating technique is utilized to form the photosensitive layer 160 on the structure of FIG. 4. The photosensitive layer 160 can be a positive-type or negative-type resist material and may have a multi-layer structure. The light causes a chemical change in exposed regions of the photosensitive layer 160, which may increase or decrease solubility of the exposed regions. If the exposed regions become more soluble, the photosensitive layer 160 is referred to as a positive photoresist. If the exposed regions become less soluble, the photosensitive layer 160 is referred to as a negative photoresist. The photosensitive layer 160 is in contact with the first bumps 150 and the second bumps 155, and at least portions of the photosensitive layer 160 extend into the first openings 202 and the second openings 204.

An exposure process 300 is performed on the photosensitive layer 160 to define at least one removing portion 168 in the photosensitive layer 160. During the exposure process 300, a radiation energy (light beam) such as ultraviolet (UV) or extra ultraviolet (EUV) may be employed and passed through an imaging lens system and a mask having a predefined pattern. The radiation energy is then directed to the photosensitive layer 160 coated on the substrate 110. In some embodiments, baking processes may be performed before or after exposing the photosensitive layer 160, such as a post-exposure baking process.

Reference is made to FIG. 6. The photosensitive layer 160 is patterned to form at least one photosensitive material 162. For example, the photosensitive layer 160 in FIG. 5 is patterned to be a plurality of photosensitive material 162. In some embodiments, a developing process is performed to selectively remove (or strip) the removing portion 168 of FIG. 5 with a developing solution creating an exposure pattern in the photosensitive layer 160. A reagent removes (or strips) the removing portion 168 of the photosensitive layer 160, and photosensitive materials 162 are respectively formed on the first bumps 150 and expose the second bumps 155.

In FIG. 6, since the removing portion 168 of the photosensitive layer 160 is stripped, the top surfaces of the second bumps 155 are not damaged during the removing process, such that the top surfaces of the second bumps 155 can be substantially flat. Or, in some embodiments, the roughness of the top surfaces of the second bump 155 is less than about 10 nm. With such configuration, the top surface of the second bump 155 can be a good contact surface for an active device attached thereon in the following process. Furthermore, since the top surface of the second bump 155 is not damaged (such as forming a recess at the top surface), the electro-migration effect in the second conductive material 159 can be avoided or improved.

Figure 7:
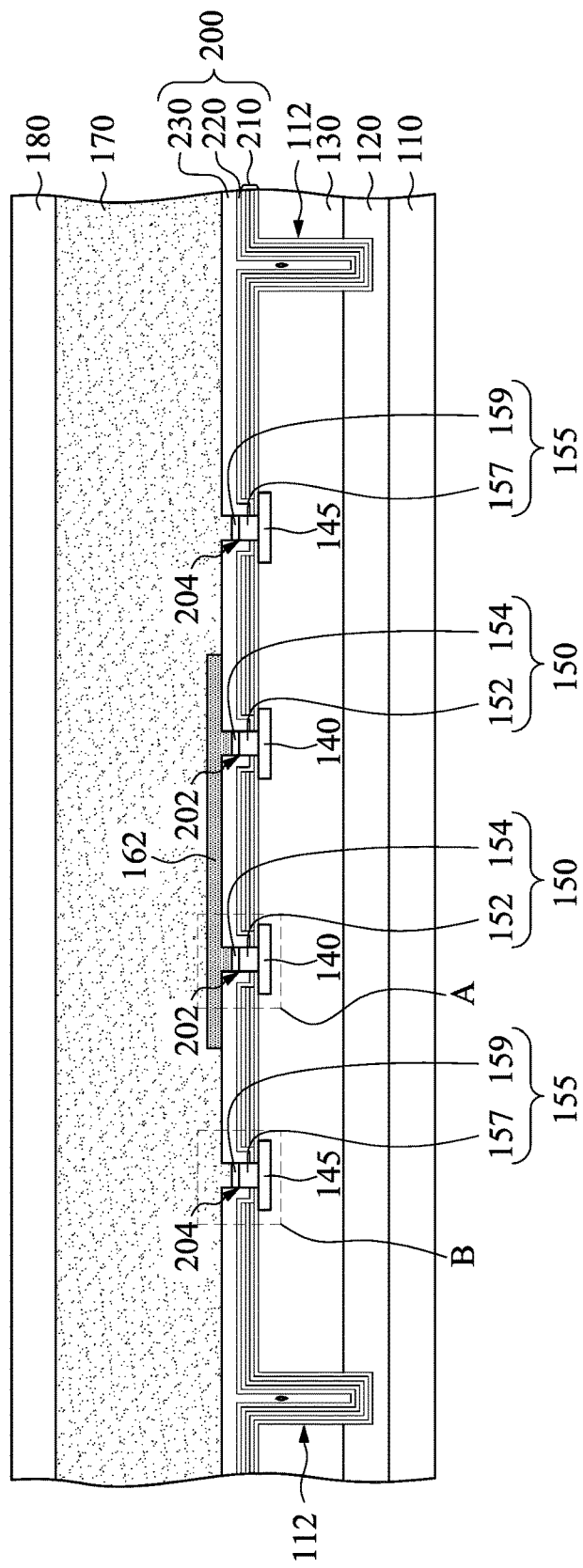

Reference is made to FIG. 7. A carrier 180 is bonded to the structure of FIG. 6, for example, through a bonding process. The bonding procedure may include one or more suitable bonding procedure(s) for specific application and materials. For example, direct bonding, metal diffusion, anodic, oxide fusion bonding, and the like bonding methods may be performed. In some embodiments, a polymer, such as bis-benzocyclobutene (BCB), epoxy, an organic glue, or the like, is utilized as a bonding material. In FIG. 7, the bonding material may be applied to the carrier 180 and/or the structure of FIG. 6.

In FIG. 7, a bonding layer 170 made of BCB or other suitable material is provided between the carrier 180 and the structure of FIG. 6 to bond the carrier 180 on the structure of FIG. 6. The bonding layer 170 is in contact with the photosensitive material 162 and the second bumps 155. That is, at least portions of the bonding layer 170 are formed in the second openings 204. With such configuration, the carrier 180 is bonded to the structure of FIG. 6.

Figure 8:
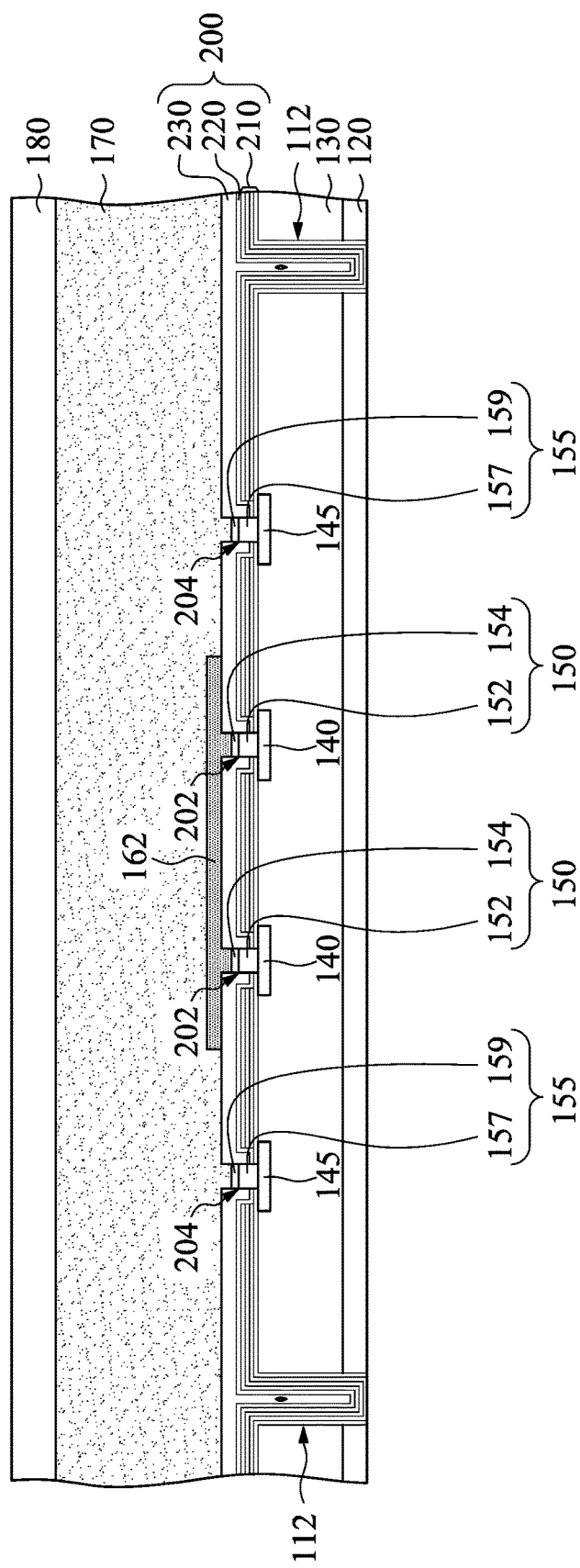

Reference is made to FIG. 8. The substrate 110 of FIG. 7 and a portion of the semiconductor layer 120 are removed to expose the sacrificial layer 200 in the trenches 112. For example, the substrate 110 of FIG. 7 and the portion of the semiconductor layer 120 are removed through a grinding process or other suitable processes.

Reference is made to FIG. 9. The sacrificial layer 200 of FIG. 8 is removed to form the semiconductor structure. For example, the sacrificial layer 200 can be removed by using a wet etch dip in HF or a vapor HF etch process. An etchant used for the wet etch may be, in some embodiments, diluted HF (DHF) solution. DHF may be as little as 1% (1:100 ratio of $HF:H_2O$) and may vary up to 1:1 for concentrated HF solution (49%). Alternatives include, for example, buffered etchants such buffered HF (BHF) or buffered oxide etch (BOE), which may include $NH_4$. The etching process is an immersion or spray process and the trenches 112 allow the flow of the etching solution to move in the space between the bonding layer 170 and the interconnect structure 130 to etch out the sacrificial layer 200. This results that the bonding layer 170 and the carrier 180 are suspended on the first bumps 150 and the second bumps 155. After removing the sacrificial layer 200, an air gap 240 is formed between the bonding layer 170 and the interconnect structure 130.

The semiconductor structure of FIG. 9 can be transferred or delivered to a next stage for some following processes. During the delivery period, the bonding layer 170, the photosensitive material 162, and the carrier 180 can be a protection layer to protect the structure underneath. After the delivery, the semiconductor structure can be performed a bonding process, which bonds a plurality of active devices respectively to the first bumps 150 and the second bumps 155. In greater detail, the bonding layer 170, the photosensitive material 162, and the carrier 180 are stripped off from the first bumps 150 and the second bumps 155, such that top surfaces of the first bumps 150 and the second bumps 155 are exposed. The active devices (such as light-emitting diodes, LEDs) are then bonded to the first bumps 150 and the second bumps 155. Hence, the remaining semiconductor structure (the structure in FIG. 9 without the bonding layer 170, the photosensitive material 162, and the carrier 180) can be a mounting board or a circuit board of the active devices.

FIG. 10A is an enlarged view of area A in FIG. 9, and FIG. 10B is an enlarged view of area B in FIG. 9. Reference is made to FIGS. 9-10B. The first bump 150 is disposed between and in contact with the first metal pad 140 and the photosensitive material 162 while the second bump 155 is disposed between and in contact with the second metal pad 145 and the bonding layer 170. The adhesion strength between the first bump 150 and the photosensitive material 162 is different from the adhesion strength between the second bump 155 and the bonding layer 170. As such, the total adhesion strength can be adjusted by determining the number of the first bumps 150, which are in contact with the photosensitive material 162, and the number of the second bumps 155, which are in contact with the bonding layer 170. The number of the first bumps 150 can be greater than, equal to, or less than the number of the second bumps 155.

In FIGS. 9 and 10A, the photosensitive material 162 includes a top portion 163 and a bottom portion 164. The top portion 163 has a width W1 and is embedded in the bonding layer 170. The bottom portion 164 has a width W2 less than the width W1. The bottom portion 164 protrudes from the top portion 163, is disposed between the top portion 163 and the first bump 150, and is in contact with the second conductive material 154 of the first bump 150. An interface 162b of the second conductive material 154 and the photosensitive material 162 is substantially flat. Or, in some embodiments, the roughness of the interface 162b is smaller than about 10 nm. Moreover, the top portion 163 of the photosensitive material 162 is connected to a plurality of the bottom portions 164 of the photosensitive material 162 as shown in FIG. 9. Furthermore, the first bump 150 has a width W3, which is substantially the same as the width W2 of the photosensitive material 162. The air gap 240 is further formed between the top portion 163 of the photosensitive material 162 and the first metal pad 140, and surrounds the bottom portion 164 of the photosensitive material 162 and the first bump 150. In some embodiments, the width W3 is less than about 2 µm. In some embodiments, the height h of the photosensitive material 162 is in a range of about 0.1 µm to about 2 µm.

In FIGS. 9 and 10B, the bonding layer 170 includes a base portion 172 and a first protruding portion 174 protruding from the base portion 172 and is in contact with the second conductive material 159 of the second bump 155. That is, the first protruding portion 174 is disposed between the base portion 172 and the second bump 155. An interface 170b of the bonding layer 170 and the second bump 155 is substantially flat. Or, in some embodiments, the roughness of the interface 170b is smaller than about 10 nm. The first protruding portion 174 has a width W4, and the second bump 155 has a width W5 substantially the same as the width W4. The air gap 240 is further formed between the bonding layer 170 and the second metal pad 145, and surrounds the first protruding portion 174 of the bonding layer 170 and the second bump 155.

In some embodiments, the semiconductor structure (such as the semiconductor structures of FIGS. 7 and 8) can be delivered to the next stage before the sacrificial layer 200 is removed. With such configuration, the sacrificial layer 200 can protect the conductive elements (such as the first bumps 150, the second bumps 155, the first metal pad 140, and the second metal pad 145) of the semiconductor structure from adhering external contaminants during the delivery process.

Figure 11B:
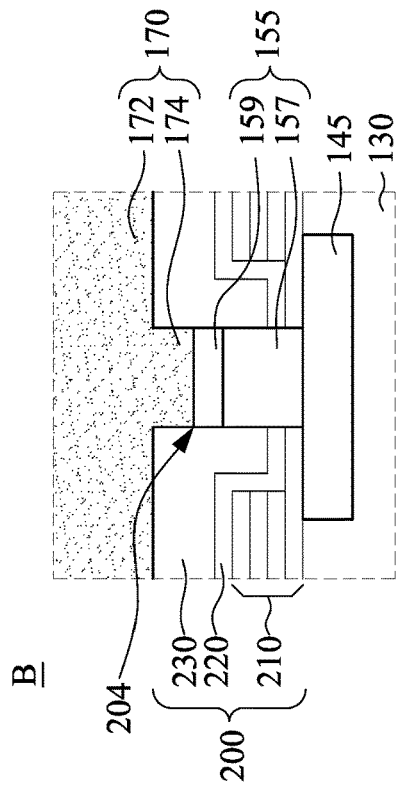
FIG. 11B is an enlarged view of area B in FIG. 7.
Figure 11A:
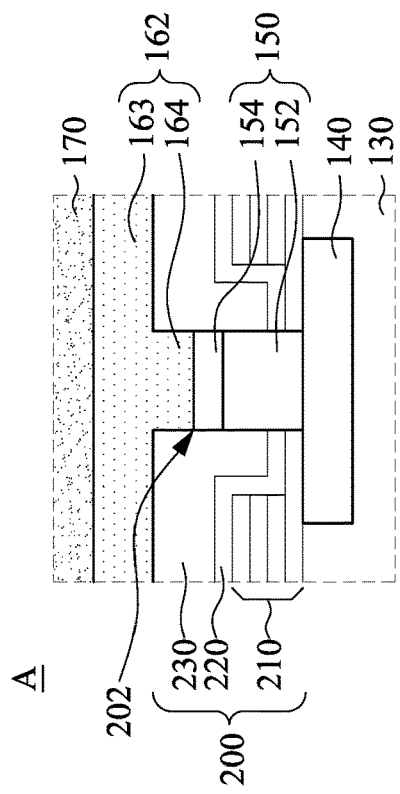
FIG. 11A is an enlarged view of area A in FIG. 7.

FIG. 11A is an enlarged view of area A in FIG. 7. Reference is made to FIGS. 7 and 11A. The bottom portion 164 of the photosensitive material 162 is disposed in the first opening 202 of the sacrificial layer 200 and on the first bump 150, and the top portion 163 of the photosensitive material 162 is disposed on the sacrificial layer 200. The sacrificial layer 200 is in contact with the photosensitive material 162, the first bumps 150, the first metal pads 140, the bonding layer 170, and the interconnect structure 130.

FIG. 11B is an enlarged view of area B in FIG. 7. Reference is made to FIGS. 7 and 11B. The first protruding portion 174 of the bonding layer 170 is disposed in the second opening 204 of the sacrificial layer 200 and on the second bump 155. The sacrificial layer 200 is further in contact with the second bumps 155, the second metal pads 145, the bonding layer 170, and the interconnect structure 130.

Figure 12:
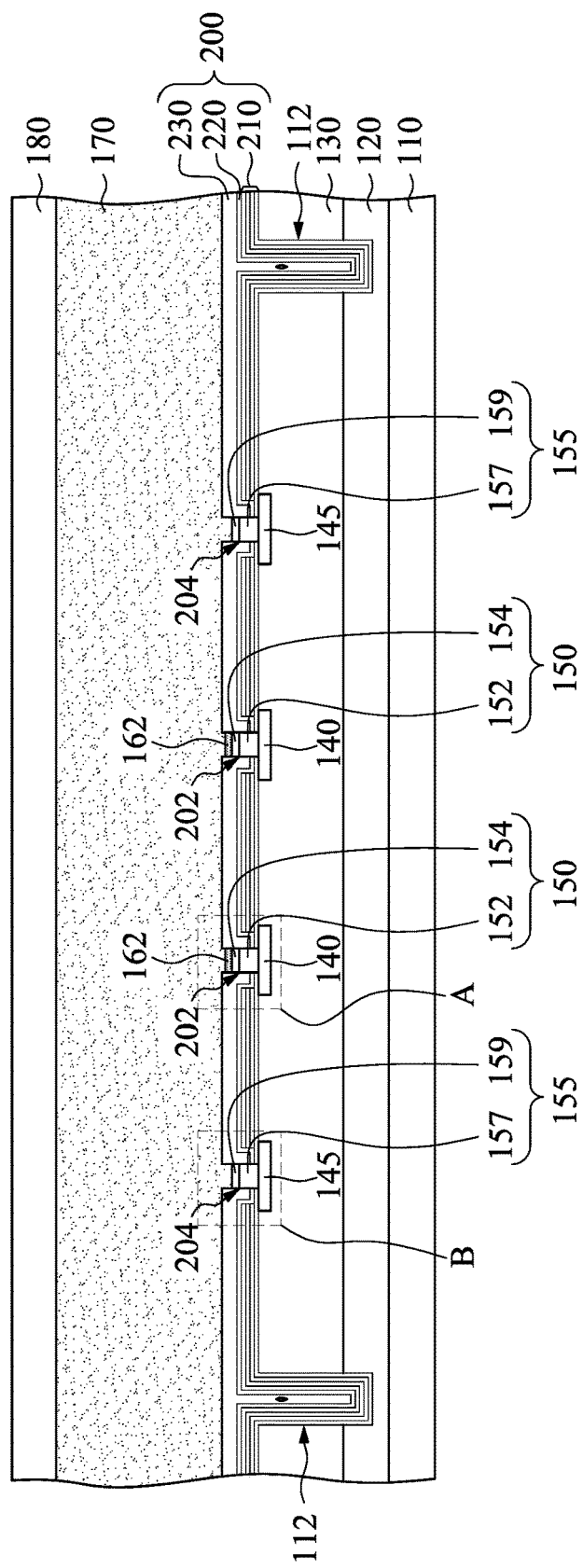
FIG. 12 is a cross-sectional view of a semiconductor structure in accordance with some embodiments of the present disclosure.
Figures 13A, 13B:
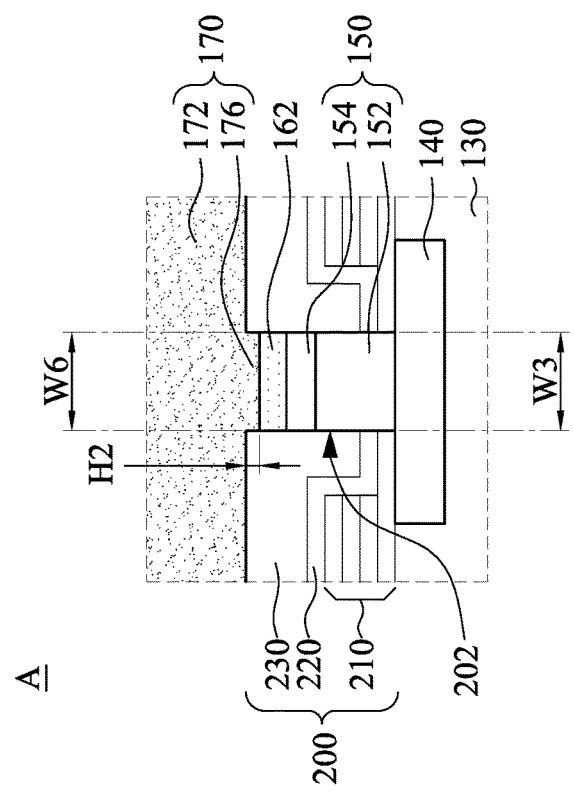
FIG. 13A is an enlarged view of area A in FIG. 12.
FIG. 13B is an enlarged view of area B in FIG. 12.

FIG. 12 is a cross-sectional view of a semiconductor structure in accordance with some embodiments of the present disclosure, FIG. 13A is an enlarged view of area A in FIG. 12, and FIG. 13B is an enlarged view of area B in FIG. 12. The difference between the semiconductor structures of FIGS. 12 and 7 pertains to the profile of the photosensitive materials 162. In FIG. 12, the photosensitive materials 162 are respectively disposed in the first openings 202 and separated from each other. Furthermore, the bonding layer 170 further includes a second protruding portion 176 disposed in the first opening 202 and on the photosensitive material 162. That is, the second protruding portion 176 is disposed between the base portion 172 of the bonding layer 170 and the photosensitive material 1762. The height H2 of the second protruding portion 176 of the bonding layer 170 is less than the height H1 of the first protruding portion 174 of the bonding layer 170. The width W6 of the second protruding portion 176 and the width W3 of the first bump 150 are substantially the same. The sacrificial layer 200 is in contact with the photosensitive material 162, the first bumps 150, the second bumps 155, the first metal pads 140, the second metal pads 145, the bonding layer 170, and the interconnect structure 130. Other relevant structural details of the semiconductor structure of FIG. 12 are similar to the semiconductor structure of FIG. 7, and, therefore, a description in this regard will not be repeated hereinafter.

FIG. 14 is a cross-sectional view of a semiconductor structure in accordance with some embodiments of the present disclosure, FIG. 15A is an enlarged view of area A in FIG. 14, and FIG. 15B is an enlarged view of area B in FIG. 14. The difference between the semiconductor structures of FIGS. 14 and 9 pertains to the profile of the photosensitive materials 162. In FIG. 14, the photosensitive materials 162 are respectively disposed on the first bumps 150 and separated from each other. Furthermore, the second portions 174 of the bonding layer 170 are respectively disposed on the photosensitive material 162. The air gap 240 is formed between the bonding layer 170 and the first metal pads 140 (the second metal pads 145) and surrounds the first bumps 150, the second bumps 155, the photosensitive materials 162, the first portions 172 and the second portions 174 of the bonding layer 170. Other relevant structural details of the semiconductor structure of FIG. 14 are similar to the semiconductor structure of FIG. 9, and, therefore, a description in this regard will not be repeated hereinafter.

According to some embodiments, since the removing portion of the photosensitive layer is stripped, the top surfaces of the second bumps are not damaged during the removing process, such that the top surfaces of the second bumps can be substantially flat. Or, in some embodiments, the roughness of the top surfaces of the second bump is less than about 10 nm. With such configuration, the top surface of the second bump can be a good contact surface for an active device attached thereon in the following process. Furthermore, since the top surface of the second bump is not damaged (such as forming a recess at the top surface), the electro-migration effect in the second conductive material can be avoided or improved.

According to some embodiments, a semiconductor structure includes an interconnect structure, at least one first metal pad, at least one second metal pad, at least one first bump, at least one second bump, at least one photosensitive material, and a bonding layer. The first metal pad and the second metal pad are disposed on and electrically connected to the interconnect structure. The first bump is disposed on the first metal pad. The second bump is disposed on the second metal pad. The photosensitive material is disposed on the first bump. The bonding layer is in contact with the photosensitive material and the second bump. The photosensitive material is disposed between the first bump and the bonding layer.

According to some embodiments, a semiconductor structure includes an interconnect structure, a plurality of first metal pads, at least one second metal pad, a plurality of first bumps, at least one second bump, at least one photosensitive material, and a bonding layer. The first metal pads and the second metal pad are disposed on and electrically connected to the interconnect structure. The first bumps are respectively disposed on the first metal pads. The second bump are disposed on the second metal pad. The photosensitive material is disposed on the first bumps. The photosensitive material is in contact with the first bumps. The bonding layer is in contact with the photosensitive material and the second bump. The photosensitive material is disposed between the first bumps and the bonding layer.

According to some embodiments, a method for manufacturing a semiconductor structure includes forming at least one first metal pad and at least one second metal pad on an interconnect structure. A sacrificial layer is formed on the interconnect structure, the first metal pad, and the second metal pad. At least one first opening and at least one second opening are formed in the sacrificial layer. The first opening exposes the first metal pad, and the second opening exposes the second metal pad. A first bump is formed in the first opening and a second bump is formed in the second opening. A photosensitive layer is formed on the sacrificial layer, the first bump, and the second bump. The photosensitive layer is patterned to form a photosensitive material on the first bump while the second bump is exposed by the photosensitive material. A bonding layer is formed on the sacrificial layer, the photosensitive material, and the second bump.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   an interconnect structure;
   at least one first metal pad and at least one second metal pad disposed on and electrically connected to the interconnect structure;
   at least one first bump disposed on the first metal pad;
   at least one second bump disposed on the second metal pad;
   at least one photosensitive material disposed on the first bump; and
   a bonding layer in contact with the photosensitive material and the second bump, wherein the photosensitive material is disposed between the first bump and the bonding layer.

2. The semiconductor structure of claim 1, wherein the photosensitive material comprises:
   a top portion having a first width and embedded in the bonding layer; and
   a bottom portion having a second width less than the first width, wherein the bottom portion is disposed between the top portion and the first bump.

3. The semiconductor structure of claim 1, wherein the bonding layer comprises:
   a base portion; and
   a first protruding portion disposed between and in contact with the second bump and the base portion.

4. The semiconductor structure of claim 3, wherein a width of the first protruding portion and a width of the second bump are substantially the same.

5. The semiconductor structure of claim 3, wherein the bonding layer further comprises:
   at least one second protruding portion disposed between and in contact with one of the photosensitive material and the base portion.

6. The semiconductor structure of claim 5, wherein a width of the second protruding portion and a width of the first bump are substantially the same.

7. The semiconductor structure of claim 5, wherein the first protruding portion has a first height, and the second protruding portion has a second height less than the first height.

8. The semiconductor structure of claim 1, wherein an air gap is formed between the bonding layer and the interconnect structure.

9. The semiconductor structure of claim 1, further comprising a sacrificial layer disposed between the bonding layer and the interconnect structure.

10. The semiconductor structure of claim 1, wherein the first bump comprises:
    a first conductive material disposed on the first metal pad; and
    a second conductive material disposed on the first conductive material, wherein an interface of the second conductive material and the photosensitive material is substantially flat.

11. A semiconductor structure, comprising:
    an interconnect structure;
    a plurality of first metal pads and at least one second metal pad disposed on and electrically connected to the interconnect structure;
    a plurality of first humps respectively disposed on the first metal pads;
    at least one second bump disposed on the second metal pad;
    at least one photosensitive material disposed on the first bumps, wherein the photosensitive material is in contact with the first bumps; and
    a bonding layer in contact with the photosensitive material and the second bump, wherein the photosensitive material is disposed between the first bumps and the bonding layer.

12. The semiconductor structure of claim 11, wherein the photosensitive material comprises:
    a top portion having a first width and embedded in the bonding layer; and
    a plurality of bottom portions protruding from the top portion and respectively in contact with the first bumps, at least one of the bottom portions having a second width less than the first width.

13. The semiconductor structure of claim 11, wherein a plurality of the photosensitive materials are respectively disposed on the first bumps, and the photosensitive materials are separated from each other.

14. A semiconductor structure, comprising:
    an interconnect structure;
    a first metal pad connected to the interconnect structure;
    a first bump on the first metal pad;
    a photosensitive material; and
    a bonding layer on the photosensitive material and the first bump and having the same width as the photosensitive material and the first bump.

15. The semiconductor structure of claim 14, wherein an interface of the first bump and the bonding layer is substantially flat.

16. The semiconductor structure of claim 14, further comprising:
    a second metal pad connected to the interconnect structure; and
    a second bump on the second metal pad, wherein the photosensitive material is on the second bump.

17. The semiconductor structure of claim 16, wherein an interface of the photosensitive material and the second bump is substantially flat.

18. The semiconductor structure of claim 14, wherein the photosensitive material and the interconnect structure define an air gap therebetween.

19. The semiconductor structure of claim 16, wherein the first bump and the second bump define an air gap therebetween.

20. The semiconductor structure of claim 14, wherein the photosensitive material is between the first bump and the bonding layer.

* * * * *